US009941814B2

United States Patent
Farese et al.

(10) Patent No.: US 9,941,814 B2
(45) Date of Patent: Apr. 10, 2018

(54) METHOD FOR DETECTING ISLANDING IN GRID CONNECTED POWER GENERATION SYSTEMS AND RELATED DC/AC CONVERTER APPARATUS

(71) Applicant: ABB Technology AG, Zurich (CH)

(72) Inventors: Luca Farese, Terranuova Bracciolini (IT); Sauro Macerini, Frazione Levane-Bucine (IT)

(73) Assignee: ABB Schweiz AG, Baden (CH)

( * ) Notice: Subject to any disclaimer, the term of this patent is extended or adjusted under 35 U.S.C. 154(b) by 67 days.

(21) Appl. No.: 15/091,362

(22) Filed: Apr. 5, 2016

(65) Prior Publication Data

US 2016/0301328 A1 Oct. 13, 2016

(30) Foreign Application Priority Data

Apr. 9, 2015 (EP) .................................. 15162965

(51) Int. Cl.
*H02M 7/44* (2006.01)
*H02J 3/38* (2006.01)
*G01R 19/175* (2006.01)
*G01R 23/15* (2006.01)

(52) U.S. Cl.
CPC ............ *H02M 7/44* (2013.01); *G01R 19/175* (2013.01); *G01R 23/15* (2013.01); *H02J 3/382* (2013.01); *H02J 2003/388* (2013.01)

(58) Field of Classification Search
CPC ....... H02M 7/44; H02J 3/382; H02J 2003/388
See application file for complete search history.

(56) References Cited

U.S. PATENT DOCUMENTS

| | | | |
|---|---|---|---|
| 6,429,546 B1 | 8/2002 | Ropp et al. | |
| 7,408,268 B1* | 8/2008 | Nocentini | H02J 3/38 307/16 |
| 7,906,870 B2 | 3/2011 | Ohm | |
| 2008/0122293 A1 | 5/2008 | Ohm | |
| 2011/0309684 A1* | 12/2011 | Song | H02J 3/383 307/87 |
| 2013/0234518 A1* | 9/2013 | Mumtaz | H02J 3/40 307/46 |
| 2014/0015326 A1* | 1/2014 | Eberhardt | H02J 3/383 307/82 |
| 2014/0078625 A1 | 3/2014 | Zheng et al. | |
| 2015/0168473 A1* | 6/2015 | Fornage | G01R 31/025 324/509 |

FOREIGN PATENT DOCUMENTS

WO 2004054081 A2 6/2004

OTHER PUBLICATIONS

European Patent Office, Extended Search Report issued in corresponding Application No. 15162965.6, dated Sep. 21, 2015, 8 pp.

* cited by examiner

*Primary Examiner* — Jue Zhang
*Assistant Examiner* — Lakaisha Jackson
(74) *Attorney, Agent, or Firm* — Taft Stettinius & Hollister LLP

(57) ABSTRACT

Method for detecting an islanding condition of a grid connected energy conversion system and related DC/AC converter apparatus, adapted to optimize performance in terms of preservation of the power quality, provide synchronized perturbation for all the inverters of a plant, provide shut down capability within the time requested by utilities and safety standards and provide immunity to grid frequency fluctuations.

20 Claims, 3 Drawing Sheets

METHOD FOR DETECTING ISLANDING IN GRID CONNECTED POWER GENERATION SYSTEMS AND RELATED DC/AC CONVERTER APPARATUS

TECHNICAL FIELD

The present invention relates to power conversion and generation systems, in particular, the present invention relates to methods for detecting islanding conditions in power conversion and generation systems adapted to be connected directly to the power grid.

BACKGROUND

The present invention concerns a method for detecting islanding of DC/AC converters operating in grid connected mode and related DC/AC converter apparatus.

Grid connected power conversion and generation systems are adapted to generate electrical power for direct delivery to the power grid, in particular converting electrical power generated by renewable sources, such as, for instance, photovoltaic panels and wind turbines. Said power conversion and generation systems usually comprise an inverter apparatus adapted to convert a DC input voltage into an AC output voltage characterized by amplitude and frequency as required by the power grid specifications. Said inverters are generally adapted to be connected directly to the power grid and typically comprise a semiconductor H-bridge circuit working as a DC-AC converter.

Grid-connected power generation units need to comply with safety standards and regulations to be certified safe to connect to the public power grid. In particular, grid-connected systems need to be safe against islanding, the condition in which the power generation unit continues to power a location even though electrical grid power from the electric utility is no longer present. Islanding can be dangerous to utility workers, who may not realize that a circuit is still powered, and it may prevent automatic re-connection of devices. For that reason, power generation units must be adapted to detect islanding conditions and immediately stop producing power. Power generation units need therefore to be provided with anti-islanding capabilities that force the disconnection of the output of the DC/AC converter from the AC mains in case the mains voltage is missing.

This requirement can be fulfilled if the inverter of the power generation unit is provided with means to detect islanding and is connected to the grid via a suitable automatic switching circuit, preventing unintentional connection to a sub-grid or to a stand-alone grid and therefore preventing islanding conditions to happen.

Today there are various methods available to detect islanding and avoid non-safe operation in islanding mode for grid connected power systems applications, said methods being generally divided in passive and active methods.

Passive methods monitor parameters such as voltage and frequency, the grid voltage change rate or the grid frequency change rate and prevent the supplying of power from the inverter to the grid if the detected working conditions differ from the nominal ones. Examples of state of the art passive methods are based on the detection and analysis of voltage phase jump, rate of change of frequency, rate of change of voltage, current harmonics.

Active methods generally introduce disturbances to the connected circuit and then monitor the response to determine if the utility grid is still connected; some active methods are based on the communications between the inverter and the utility and are adapted to stop the inverter from supplying power to the grid when emergency occurs.

Examples of state of the art active methods are based on detection and analysis of impedance, frequency shift, frequency drift, Variation of Active Power and/or Reactive Power, Frequency Jump, Sandia Frequency Shift, Sandia Voltage Shift. Active methods are generally preferred by the inverter manufacturers because have lower NDZ (Non Detection Zones) and faster detection times compared to passive methods.

State of the art methods for detecting island conditions during inverter operation are generally affected by drawbacks concerning the immunity to frequency variations when grid connected, the stability of the system, the preservation of the power quality, the synchronization of the perturbation when there are multiple inverters in a plant.

In detail, the operation of one of the most common state of the art methods for detecting island conditions, based on the periodic injection of reactive power, is hereby described. This method is based on the idea of attempting to shift the frequency of the voltage at the point of common coupling (PCC), $V_{PCC}$, by injecting reactive power on a time interval.

When the grid utility is connected, the frequency will not shift because the reactive power in the system is such that:

$$Q_{load} = Q_{inv} + \Delta Q$$

Thus, when $Q_{inv}$ changes, $\Delta Q$ changes accordingly in order to satisfy the reactive power $Q_{load}$ requested by the load.

When grid is disconnected, $\Delta Q$ is not available anymore to balance the load request, therefore:

$$Q_{load} = Q_{inv}$$

The only way to preserve the balance condition when $Q_{inv}$ changes is therefore a frequency change since:

$$Q_{load} = (V_{PCC})^2 \cdot \left(\frac{1}{\omega L} - \omega C\right)$$

Thus, whenever the inverter detects a frequency shift in response to an injection of reactive power an island condition is detected.

The above method is characterized by a few drawbacks namely the lack of immunity to frequency variations when grid is connected, the synchronization between multiple connected inverters and the high level of perturbation introduced in the system.

Other state of the art methods for detecting island conditions during inverter operation make use of positive feedback control loops in order to start a frequency drift in a test signal. These methods usually show stability problems for instance when a weak utility is connected to the inverter, then possible instability in the power output can cause transients in the system and the positive feedback control loop to detect islanding can amplify and increase that instability.

It is therefore an object of the present invention to introduce a new method for the reliable detection and management of islanding conditions in grid connected inverters to overcome the state-of-the-art methods drawbacks.

In particular, it is an object of the present invention to introduce a new method, a related new AC/DC converter and a new power generation system comprising said AC/DC converter, for the reliable detection and management of islanding conditions regarding multiple grid connected inverters of the same plant.

The method according to the present invention is further adapted to optimize performance in terms of preservation of the power quality; provide synchronized perturbation for all the inverters of a plant; provide inverter shut down capability within the time requested by utilities and safety standards; provide immunity to grid frequency fluctuations.

Further features and advantages of the present invention will be apparent in the following description of a non-limitative embodiment with reference to the figures in the accompanying drawings, which are diagrammatic and show functional blocks which are adapted to be made according to different circuitry solutions in practice.

In detail:

DETAILED DESCRIPTION

Figure 1:
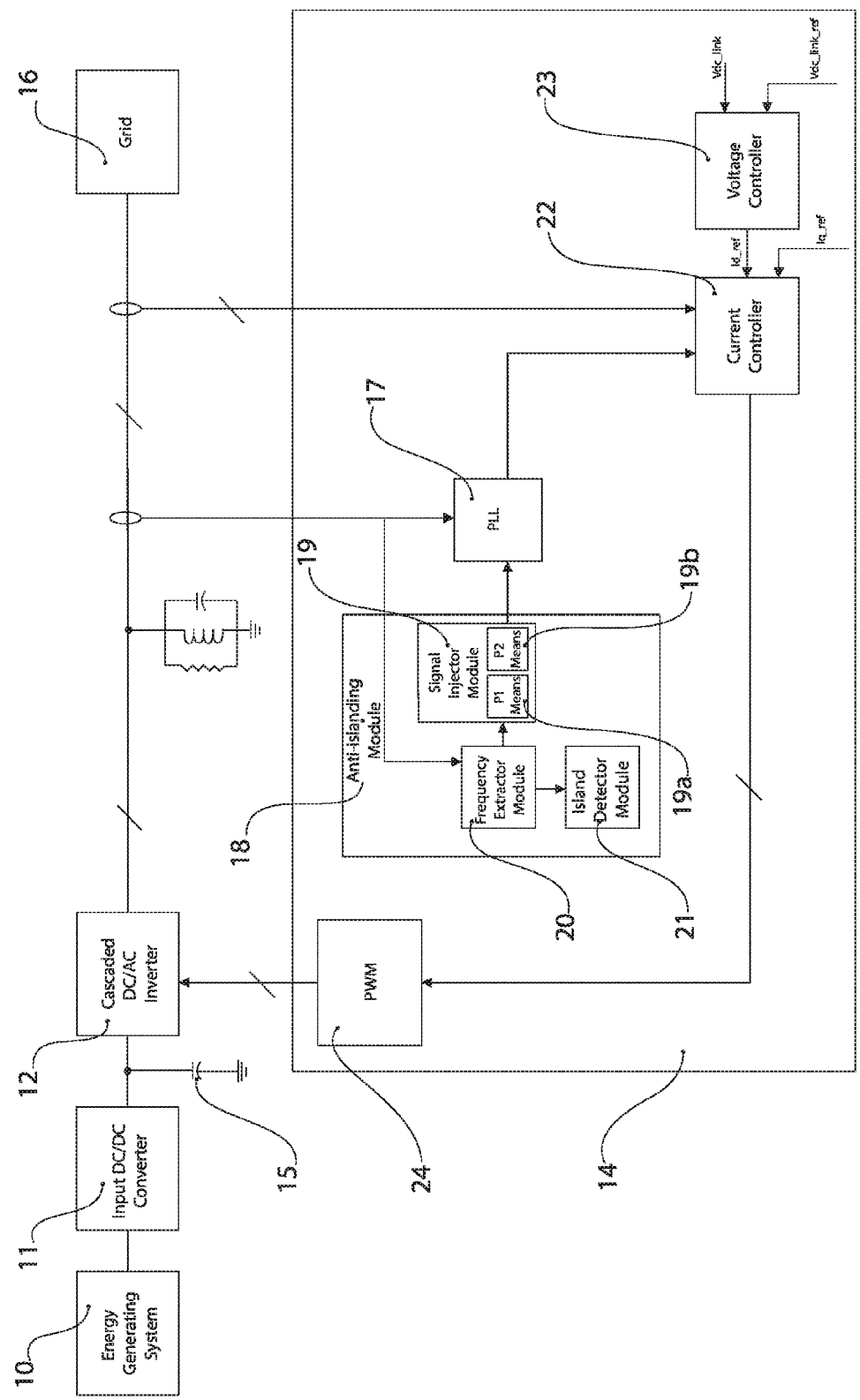
FIG. 1 shows a block diagram of a grid connected DC/AC converter with a controller provided with an anti-islanding module according to the present invention.

FIG. 1 shows a generic block diagram of a grid connected single-phase or multi-phase inverter comprising an energy generating system 10—for instance a photovoltaic generator or a wind generator—and a DC/AC converter.

The DC/AC converter generally comprises an input DC/DC converter 11, a cascaded DC/AC inverter 12 and a control module 14 comprising, for instance, a current controller 22, a voltage controller 23 and a PWM modulator 24.

The input DC/DC converter 11 is adapted to boost the output direct voltage of said energy generating system 10 to the predetermined voltage level. In case the energy generating system 10 is a photovoltaic generator, said input DC/DC converter 11 may be further adapted to track the maximum power point from the photovoltaic generator. In this case, the DC/DC converter 11 serves to perform the maximum power point tracking (MPPT) from the output of the photovoltaic generator varying according to the insolation and temperature and extract the maximum power to store it in a capacitor bank 15 at the DC-Link end, output of said DC/DC converter.

The control of the DC-Link end voltage is performed by said control module 14. When the maximum power of the photovoltaic generator is extracted from the DC/DC converter 11, the DC-Link end voltage is boosted and the DC/AC inverter injects the energy stored in the DC-Link end into the grid 16.

The DC/AC inverter is adapted to convert direct voltage from the DC/DC converter 11 into alternating voltage to supply the inverter current to the grid 16.

Thus, the DC/AC converter turns the voltage from the energy generating system 10 into an alternating (AC) voltage synchronized with the grid phase and supplies it to the grid 16.

The control module 14 generally comprises an inner current loop adapted to control the grid current and an outer voltage loop adapted to control the dc link voltage.

In general terms, the current loop may be adapted to regulate the active current $I_D$ and the reactive current $I_Q$ to the values $I_{D\_ref}$ and $I_{Q\_ref}$, the voltage loop is adapted to regulate the power flow balancing within the system.

Said control module 14 comprises a block adapted to track the grid frequency, for instance a phase locked loop (PLL) 17.

In inverters provided with anti-islanding capability, said control module 14 further comprises an anti-islanding module 18.

Anti-islanding methods based on frequency bias are adapted to modify the waveform of the tracking signal of the PLL or the generic block adapted to track the grid phase or the grid frequency.

Figure 3:
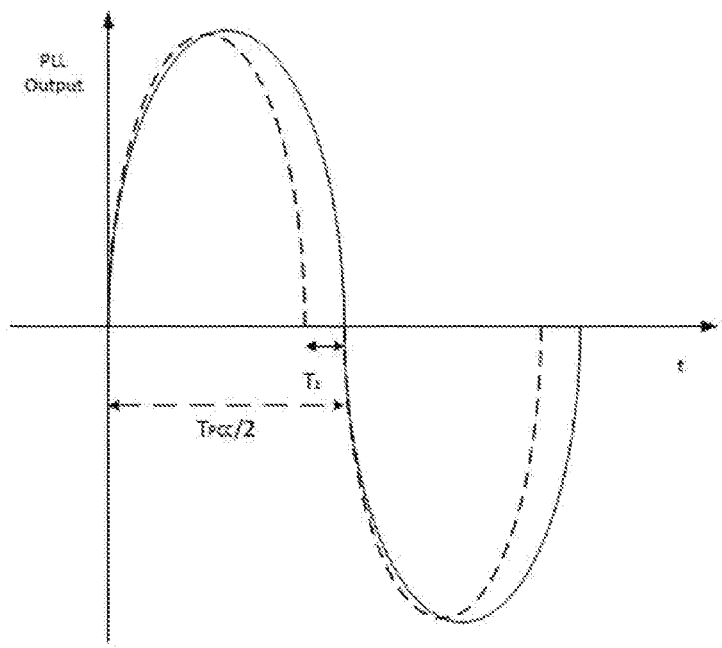
FIG. 3 shows the waveforms related to the PLL output in normal operation and after a perturbation is applied to the PLL.

Assuming the block adapted to track the grid phase or the grid frequency to be a PLL 17, the enclosed FIG. 3 shows the waveform of the PLL tracking signal. When the PLL tracking signal is added with some perturbation, the waveform of the current injected by the inverter into the grid is distorted so that the new signal zero crossing point would be before or after the zero crossing point of the actual grid signal, while the period of the waveform is left unaltered by said perturbation.

In FIG. 3 the distorted waveform shows a higher frequency with respect to the actual grid frequency picked up at the point of common coupling (PCC voltage), same considerations would apply in case the chosen perturbation of the PLL tracking signal is such as forcing the frequency to be lower than the nominal one. The distorted waveform ends each half-cycle remaining at zero amplitude for the time $t_z$ before starting the next half-cycle.

The distorted waveform may as well have a lower frequency than the PCC voltage frequency. In this latter case, when the PCC waveform is zero, the distorted waveform is zero as well.

Same considerations apply in case a generic block adapted to track the grid phase or the grid frequency is employed in place of a PLL.

When the utility grid is connected, the utility grid opposes any change in the grid voltage frequency. If the inverter tries to change the frequency of its output current, the utility grid keeps on providing a solid phase and frequency reference to the PLL thus stabilizing the operating point at the frequency of the grid voltage and no positive feedback within the PLL control loop occurs.

On the opposite, during island condition, the frequency of the AC voltage at the PCC, $V_{PCC}$, will change due to the perturbation injected by the inverter. The inverter output voltage will then follow the injected distorted current waveform and cross the zero amplitude axis in a time ($T_{PCC}/2-t_z$) which is different from nominal half-cycle $T_{PCC}/2$. This applies also to the next half-cycle and the point of zero crossing of voltage $V_{PCC}$ shifts accordingly. Then, the frequency of the PLL output signal shifts as well in order to remain in sync with the grid voltage frequency and therefore the next perturbation is applied on the PLL signal with altered frequency, thus producing a positive feedback. As a result, the PCC AC voltage, $V_{PCC}$, undergoes a frequency drift, the detection of which can be used to determine an ongoing island condition.

Figure 2:
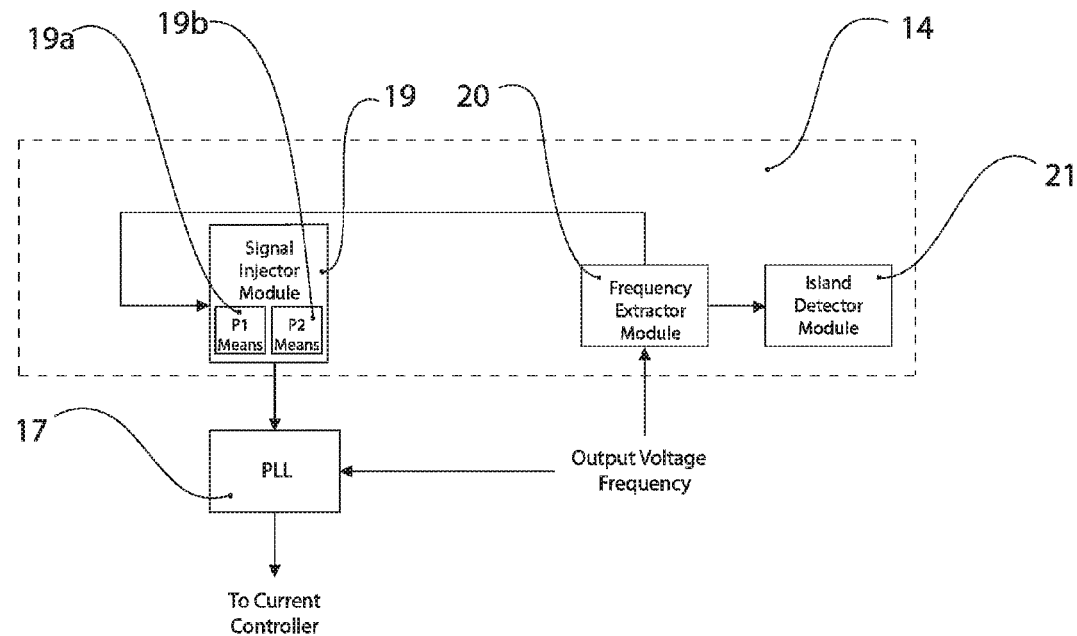
FIG. 2 shows a block diagram of an anti-islanding module according to the present invention.

With reference to the enclosed FIGS. 1 and 2, the anti-islanding module 18 according to the present invention comprises three sub-modules:

a signal injector module 19, associated to said PLL 17, comprising means 19a for generating a perturbation for the reference signal of said PLL 17, adapted to shift the frequency of the AC output voltage of said DC/AC converter, and means 19b for providing said reference signal comprising said perturbation to said PLL 17 in order to modify the PLL output waveform in a way that, during an island condition, the frequency of the voltage at the PCC shifts with respect to the nominal value;

A frequency extractor module 20, associated to said signal injector module 19 and comprising means for measuring the frequency and the frequency change of the AC voltage at the point of common coupling between said DC/AC converter and the grid;

An island detector module 21, associated to said signal injector module 19 and comprising means for generating an alarm signal and changing the operation of said DC/AC converter in order to avoid islanding, when the frequency of the AC voltage at the point of common coupling is greater than a predetermined threshold. In greater detail, said signal injector module 19 applies a perturbation to the PLL tracking signal, that, in turn, affects the current loop control signal. Said perturbation makes the zero crossing point of the PLL waveform to be before or after the zero crossing point of the actual grid signal as if the frequency is higher or lower than the actual grid signal frequency at the PCC. Then, when the waveform reaches zero, it remains at zero for time $t_z$ before the beginning of the successive half cycle.

With reference to enclosed FIG. 1, said frequency extractor module 20 operates a frequency measurement on the AC voltage at the PCC obtaining frequency samples $F_N$. In one exemplary embodiment of the present invention, said frequency measurement can be implemented through AC voltage zero crossing detection and following measurement of the time interval between two consecutive zero crossings. Measuring the frequency of the AC voltage at the point of common coupling between said DC/AC converter and the grid through detection of AC voltage zero crossing provides automatic synchronization to all the AC/DC converters belonging to the same plant and sharing the same grid.

To make the measurement more accurate and evaluate the trend of the frequency of the AC voltage at the PCC, said frequency extractor module 20 further calculates the short moving average of a small number of frequency samples $F_N$, for instance a number smaller than 10 samples, and the long moving average of a large number of frequency samples $F_N$, for instance a number larger than 50 samples, respectively.

The short moving average of a small number of the last frequency samples $F_N$, is adapted to filter the frequency measurements $F_N$ from noise, EMI and, in general, from inaccuracy of the measurement. The long moving average of a large number of last samples is adapted to sense the actual trend of the frequency measurement in order to speed up the detection of an islanding condition and the managing of the detected alarm.

Said frequency extractor module 20 provides the calculated values to said signal injector module 19.

As explained earlier, said signal injector module 19 is adapted to apply a perturbation to the PLL tracking signal that, in turn, affects the current loop control signal. Advantageously, said signal injector module 19 can apply a reference signal to the PLL—or to the generic grid voltage phase tracker or grid voltage frequency tracker—which is increased of a predetermined quantity. Therefore, the reference signal fed by said signal injector module 19 to the PLL drives the current control loop of said control module 14 so that the inverter 12 produces an output frequency $\omega_0+\Delta\omega_0$, wherein $\Delta_0$ is the nominal grid frequency.

During normal operation, when the DC/AC converter is connected to the grid and the grid voltage is present, the grid opposes any change in the grid voltage frequency. When said control module 14 drives the inverter to try and modify the frequency of its output current, the grid keeps on providing a constant phase and frequency reference to the PLL thus stabilizing the operating point at the frequency of the grid voltage and no positive feedback within said anti-islanding module 18 occurs.

On the opposite, during islanding conditions, when the DC/AC converter is connected to the grid but the grid voltage is not present, the frequency of the AC voltage at the PCC, $V_{PCC}$, will change due to the perturbation injected by said signal injector module 19 to the PLL tracking signal. Thus, a positive feedback establishes within the inverter current control loop: the PLL and the frequency extractor module 20 detect a PCC voltage frequency higher than $\omega_0$ and said signal injector module 19 keeps on applying a perturbation to the PLL tracking signal until the frequency reaches a predetermined threshold, indicating an ongoing emergency, and the DC/AC converter is switched off accordingly, thus avoiding islanding.

The perturbation applied by said signal injector module 19 to the PLL tracking signal is preferably calculated based on the past and present values of the frequency of the voltage at the node PCC, said past and present values of the frequency of the voltage at the node PCC being provided by said frequency extractor module 20.

In case the difference between said past and present values of the frequency of the AC voltage at the node PCC is larger than a predetermined threshold, then the next perturbation applied by said signal injector module 19 is increased, by an additional term $\Delta\omega$, to $\Delta\omega_0+\Delta\omega$, so that in case of islanding, the inverter working frequency grows fast until a predetermined alarm threshold is reached and the system is shut down and made safe.

In greater detail, in a preferred embodiment of the present invention, said frequency extractor module 20 periodically measures the frequency of the AC voltage at the PCC through the measurement of the period of the AC voltage at the PCC, that is the time interval between two consecutive zero crossings, and calculates the long moving average of frequency samples $F_N$, and the short moving average of frequency samples $F_N$, and finally provides the measured and calculated values to said signal injector module 19.

Said signal injector module 19 is adapted to apply a perturbation to the PLL tracking signal, that, in turn, affects the current loop control signal.

The perturbation applied comprises always a constant term, $\Delta\omega_0$, and may comprise an additional variable term, $\Delta\omega$. The constant term, $\Delta\omega_0$, is aimed at triggering the frequency drift in case a loss of mains emergency occurs.

Said constant term $\Delta\omega_0$ is chosen to be the smallest possible in order to have a negligible effect on the THD and on the $\cos \varphi$ of said DC/AC converter output while being enough to trigger the drift of the frequency of said DC/AC converter, according to the present invention. Furthermore, Said constant term $\Delta\omega_0$ can be chosen positive (adapted to cause a frequency increase) or negative (adapted to cause a frequency decrease).

The additional variable term, $\Delta\omega$, is calculated based on the trend of the frequency measurements performed by said frequency extractor module 20 and it is aimed at speeding up the discovery of the ongoing islanding condition and the following inverter shutdown.

In a preferred embodiment of the present invention said signal injector module 19 calculates said additional variable term $\Delta\omega$ as follows:

$$\Delta\omega = k\Delta F_L \text{ wherein}$$

k can be a constant value or an adaptive value, k=f($\Delta F_L$), and $$\Delta F_L = F_N - F_{AVGL},$$

$F_N$ being the frequency measurement performed at time N, or at step N, and $F_{AVGL}$ being the moving average of the last large number of frequency measurements $F_N$, said large number being, for instance, larger than 50.

Said signal injector module 19 applies said additional variable term, $\Delta\omega$, to the perturbation to the PLL tracking signal if at least one of the following conditions is true:
1) $\Delta F_L > T1$ and $F_{AVGS} < F_{MAX}$ (in case the applied perturbation is positive, therefore forcing a positive frequency drift);
2) $\Delta F_L < -T1$ and $F_{AVGS} > F_{MIN}$ (in case the applied perturbation is negative, therefore forcing a negative frequency drift);

wherein $F_{AVGS}$ is the moving average of the last small number of frequency measurements $F_N$, said small number being, for instance, equal to 8, $F_{MAX}$ is the maximum acceptable value of the PCC voltage frequency and $F_{MIN}$ is the minimum acceptable value of the PCC voltage frequency.

If none of the above conditions 1) and 2) is true, said additional variable term, $\Delta\omega$, is not applied to the perturbation to the PLL tracking signal.

If one or more of the above conditions 1) and 2) is verified true due to a faulty measurement or due to a brown-out, then $\Delta\omega$ is applied to the perturbation to the PLL tracking signal only for a limited time without reaching the alarm threshold that triggers the inverter shut-down. In this case, after the faulty measurement or the brown-out condition is no longer present, signal injector module 19 operates in a way to decrease said additional variable term, $\Delta\omega$, to zero in a predetermined time interval or in a predetermined number of cycles.

One example of possible decreasing procedure of said additional variable term, $\Delta\omega$, is the following wherein $\Delta\omega$ is decreased according to the formula:

$\Delta\omega$ (step n)=0.99*$\Delta\omega$ (step n−1) with a certain time constant, for instance equal to a few seconds.

Furthermore, if $F_{AVGS} > F_{MAX}$ or $F_{AVGS} < F_{MIN}$, then said signal injector module 19 does not increase said additional variable term, $\Delta\omega$, anymore, even in case of ongoing islanding condition.

In a preferred embodiment of the present invention, in order to speed up the detection of islanding conditions to be compliant with the safety normative concerning the matter, said constant value k, such as $\Delta\omega = k\Delta F_L$, may have two different values: a first value, k1 is applied when the frequency drift is in the starting phase, a second value, k2>k1 is applied to speed up the frequency drift in order to make the detection of the islanding condition fast enough.

In greater detail, said signal injector module 19 checks the term $\Delta F_L = F_N - F_{AVGL}$.

If $\Delta F_L$ is greater than a first threshold T1 ($\Delta F_L > T1$ or $\Delta F_L < -T1$) then k=k1.

If $\Delta F_L > T1$ (or $\Delta F_L < -T1$) constantly within a predetermined time interval and $\Delta F_L > T2$ (or $\Delta F_L < -T2$), then k=k2.

The above checks of the value of $\Delta F_L$ are to establish if $\Delta F_L$ is really increasing and there is no reading errors or jitters in the detected zero crossing of the amplitude of the AC voltage.

In a further preferred embodiment of the present invention, said constant term $\Delta\omega_0$ is chosen alternatively positive for a certain number n of cycles and negative for a certain number m of cycles with n and m being integer numbers, until a frequency drift is detected, then the sign of said constant term $\Delta\omega_0$ is kept constant and equal to the sign said constant term $\Delta\omega_0$ had when the frequency drift started.

In situations where a plurality of DC/AC converters belong to the same plant and share the same grid, they might have different loads or different point of operation and input power. As a result, said DC/AC converters might react different to the same perturbation $\Delta\omega_0$ possibly cancelling out the overall effect that should be detected on the frequency of the AC voltage at the PCC. In case this happens, an ongoing islanding condition might not be detected correctly.

Applying the above described sign shift to said constant term $\Delta\omega_0$ it is possible to avoid the possibility of the undesired cancelling effect described above. Advantageously, said number of cycles n and m can be chosen to be different integer numbers and they can be further chosen to be different prime integer numbers.

Said island detector module 21 is associated to said frequency extractor module 20, and it is adapted to detect the ongoing islanding condition and signal the alarm condition in case of islanding detection. In case the frequency of the PCC voltage is detected to be drifting, said island detector module 21 changes the operation of the inverter 12 thus guaranteeing the safety of the converter.

In a preferred embodiment of the present invention, said island detector module 21 checks the PCC voltage actual frequency against a predetermined alarm threshold $F_T$ and signals an emergency due to islanding if the detected frequency is greater (or smaller) than said threshold $F_T$.

In another preferred embodiment of the present invention, said island detector module 21 checks the PCC voltage frequency against a predetermined alarm threshold $F_T$ and signals an emergency due to islanding if the detected frequency is greater (or smaller) than said threshold for a predetermined number of consecutive measurements.

Furthermore, said island detector module 21 is adapted to signal an emergency due to islanding within a predetermined time interval in compliance with the safety normative that applies.

Figure 4:
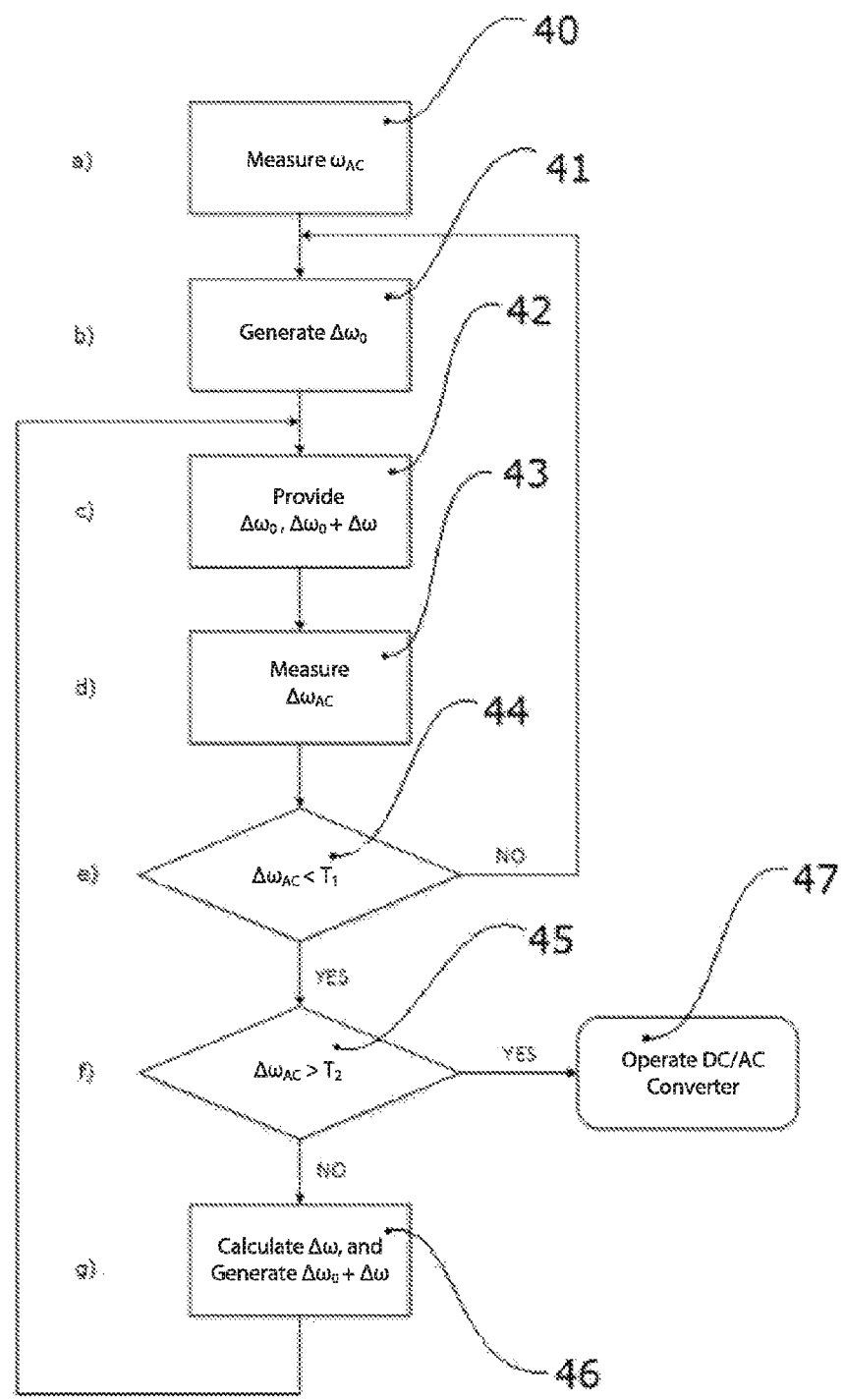
FIG. 4 shows a flowchart of the method for detecting islanding in grid connected power generation systems according to the present invention.

According to the description above and with reference to enclosed FIG. 4, the anti-islanding module 18 of the present invention performs a method for detecting islanding in grid connected power generation systems wherein the following steps are taken:
a) measuring 40 the frequency of the AC voltage ($\omega_{AC}$) at the point of common coupling between said DC/AC converter and the grid;
b) generating 41 a perturbation ($\Delta\omega_0$) for the reference signal of said means for tracking the grid frequency, in order to shift the frequency of the AC output voltage of said DC/AC converter;
c) providing 42 said means for tracking the grid frequency with a reference signal comprising said perturbation ($\Delta\omega_0$, $\Delta\omega_0 + \Delta\omega$);
d) measuring 43 the change in the frequency ($\Delta\omega_{AC}$) of the AC voltage at the point of common coupling;
e) if 44 the change in the frequency ($\Delta\omega_{AC}$) of the AC voltage at the point of common coupling is smaller than a first predetermined threshold (T1) then repeat the preceding steps starting from step b); if 44 the change in the frequency ($\Delta\omega_{AC}$) of the AC voltage at the point of common coupling is greater than a first predetermined threshold (T1):
f) if 45 the frequency of the AC voltage at the point of common coupling is greater than a second predetermined threshold (T2) then changing 47 the operation of said DC/AC converter in order to avoid islanding;

g) if 45 the frequency of the AC voltage at the point of common coupling is smaller than a second predetermined threshold (T2), then calculating 46 a new additional term ($\Delta\omega$) and generating a perturbation ($\Delta\omega_0+\Delta\omega$) for the reference signal of said means for tracking the grid frequency, comprising said additional term ($\Delta\omega$) and then repeat from step c).

Preferably, said measuring the frequency of the AC voltage at the point of common coupling between said DC/AC converter and the grid of previous steps a) and d) is performed through detection of AC voltage zero crossing.

The apparatus and method for detecting islanding in grid connected power generation systems according to the present invention introduces several advantages with respect to the state-of-the-art:

In terms of automatic synchronization, measuring the frequency of the AC voltage at the point of common coupling between said DC/AC converter and the grid through detection of AC voltage zero crossing, provides automatic synchronization of the perturbation provided to all the converters installed in the same plant, since all the inverters in a plant share the same grid. This way the zero-crossing time of the grid voltage represents the intrinsic synchronization event of the apparatus and method according to the present invention.

In terms of immunity to grid frequency variations, the present method and apparatus are adapted to detect islanding after starting a frequency drift and checking the PCC frequency against thresholds comprising a maximum and a minimum frequency thresholds, thus achieving greater immunity to grid frequency variations if compared with other state-of-the-art methods that apply a periodic perturbation and then measure variations in the PCC frequency.

In terms of stability and power quality, the present method and apparatus are adapted to apply to the PLL, or equivalent device within the control module of the converter, a fixed perturbation that is so small that power quality is not compromised. The fixed perturbation is kept very small because it just serves to trigger the frequency drift for positive feedback. Moreover, the present invention provides safety and stability in case a weak utility grid is connected. In fact, the instability at the power output of the converter will not cause undesirable transients in the converter, thanks to the control of the perturbation according to the present invention that checks the PCC frequency against a preliminary frequency threshold and checks the number of consecutive cycles of frequency drift in the same direction.

In case the control module 14 comprises a μcontroller or a DSP, said signal injector module 19, said frequency extractor module 20, said island detector module 21 and the method according to the present invention can be implemented within the firmware of said μcontroller or DSP.

The invention claimed is:

1. Method for detecting an islanding condition of a grid connected energy conversion system including a DC/AC converter including means for tracking a grid frequency, said method comprising:

a) measuring a frequency of an AC voltage at a point of common coupling between said DC/AC converter and the grid;

b) generating a perturbation ($\Delta\omega_0$) for a reference signal of said means for tracking the grid frequency, in order to shift the frequency of an AC output voltage of said DC/AC converter;

c) providing said means for tracking the grid frequency with the reference signal comprising said perturbation ($\Delta\omega_0$, $\Delta\omega_0+\Delta\omega$);

d) measuring a change in the frequency of the AC voltage at the point of common coupling;

e) if the change in the frequency of the AC voltage at the point of common coupling is smaller than a first predetermined threshold then repeat the preceding steps starting from step b); if the change in the frequency of the AC voltage at the point of common coupling is greater than said first predetermined threshold:

f) if the frequency of the AC voltage at the point of common coupling is greater than a second predetermined threshold then changing operation of said DC/AC converter in order to avoid islanding;

g) if the frequency of the AC voltage at the point of common coupling is smaller than said second predetermined threshold, then calculating a new additional term ($\Delta\omega$) and generating a perturbation ($\Delta\omega_0+\Delta\omega$), for the reference signal of said means for tracking the grid frequency, comprising said additional term ($\Delta\omega$) and then repeat the cycle from step c).

2. Method according to claim 1 wherein said perturbation ($\Delta\omega_0$) is chosen alternatively positive, for a certain number n of sub-cycles comprising steps from b) to e), and negative for a certain number m of sub-cycles comprising steps from b) to e), n and m being integer numbers, until a frequency drift is detected at step e), then the sign of a constant term $\Delta\omega_0$ is kept constant and equal to the last sign said constant term $\Delta\omega_0$ had assumed.

3. Method according to claim 2 wherein said measuring the frequency of the AC voltage at the point of common coupling between said DC/AC converter and the grid of previous steps a) and d) is performed through detection of AC voltage zero crossing.

4. Method according to claim 2 wherein the change in the frequency of the AC voltage at the point of common coupling measured at step d) is calculated as a difference between an actual value and a short moving average of a plurality of previous sampled values of said frequency, a short moving average being calculated on a number of sampled values of said frequency smaller than 10.

5. Method according to claim 2 wherein said additional term ($\Delta\omega$) is such that $\Delta\omega=k\Delta F_L$ wherein: $\Delta F_L=F_N-F_{AVGL}$, $F_N$ being a frequency measurement sampled at time N, $F_{AVGL}$ being a long moving average of said frequency samples $F_N$, said long moving average being calculated on a number of said frequency samples $F_N$ larger than 50 and a parameter k being a constant value.

6. Method according to claim 1 wherein said additional term ($\Delta\omega$) is such that $\Delta\omega=k\Delta F_L$ wherein: $\Delta F_L=F_N-F_{AVGL}$, $F_N$ being a frequency measurement sampled at time N, $F_{AVGL}$ being a long moving average of said frequency samples $F_N$, said long moving average being calculated on a number of said frequency samples $F_N$ larger than 50 and a parameter k being an adaptive value $k=f(\Delta F_L)$.

7. Method according to claim 1 wherein said measuring the frequency of the AC voltage at the point of common coupling between said DC/AC converter and the grid of previous steps a) and d) is performed through detection of AC voltage zero crossing.

8. Method according to claim 1 wherein the change in the frequency of the AC voltage at the point of common coupling measured at step d) is calculated as a difference between an actual value and a short moving average of a plurality of previous sampled values of said frequency, said short moving average being calculated on a number of sampled values of said frequency smaller than 10.

9. Method according to claim 1 wherein said additional term ($\Delta\omega$) is such that $\Delta\omega=k\Delta F_L$ wherein: $\Delta F_L=F_N-F_{AVGL}$, $F_N$ being a frequency measurement sampled at time N, $F_{AVGL}$ being a long moving average of said frequency samples $F_N$, said long moving average being calculated on a number of said frequency samples $F_N$ larger than 50 and a parameter k being a constant value.

10. Method according to claim 9 wherein said parameter k is chosen in a group comprising: a first value (k1) to be applied first, and a second value (k2), greater than said first value (k1), to be applied after in order to make the detection of the islanding condition faster.

11. A grid connectable DC/AC converter apparatus comprising: an input DC/DC converter, a cascaded DC/AC inverter and a control module including a module adapted to track a grid frequency and an anti-islanding module said anti-islanding module comprising:
  means for measuring a frequency and a frequency change of an AC voltage at a point of common coupling between said DC/AC converter and the grid;
  means for generating a perturbation ($\Delta\omega_0$, $\Delta\omega_0+\Delta\omega$) for a reference signal of said module for tracking a grid frequency, in order to shift the frequency of the AC voltage of said DC/AC converter;
  means for providing said reference signal comprising said perturbation ($\Delta\omega_0,\Delta\omega_0+\Delta\omega$) to said module for tracking the grid frequency;
  means for changing an operation of said DC/AC converter in order to avoid islanding, when the frequency of the AC voltage at the point of common coupling is greater than a predetermined threshold, wherein said perturbation ($\Delta\omega_0$, $\Delta\omega_0+\Delta\omega$) comprises a constant term ($\Delta\omega_0$), adapted to trigger a drift of said frequency of the AC voltage in case of islanding, and an optional additional variable term ($\Delta\omega$) if a drift of said frequency of the AC voltage has been triggered.

12. Apparatus according to claim 11 wherein said optional additional variable term ($\Delta\omega$) is such that $\Delta\omega=k\Delta F_L$ wherein: $\Delta F_L=F_N-F_{AVGL}$, $F_N$ being a frequency measurement sampled at time N, $F_{AVGL}$ being a long moving average of said frequency samples $F_N$, said long moving average being calculated on a number of said frequency samples $F_N$ larger than 50 and a parameter k being a constant value.

13. Apparatus according to claim 12 wherein said parameter k is chosen in a group comprising: a first value (k1) to be applied first, and a second value (k2), greater than said first value (k1), to be applied after in order to make a detection of the islanding condition faster.

14. Apparatus according to claim 11 wherein said optional additional variable term ($\Delta\omega$) is such that $\Delta\omega=k\Delta F_L$ wherein: $\Delta F_L=F_N-F_{AVGL}$, $F_N$ being a frequency measurement sampled at time N, $F_{AVGL}$ being a long moving average of said frequency samples $F_N$, said long moving average being calculated on a number of said frequency samples $F_N$ larger than 50 and a parameter k being an adaptive value $k=f(\Delta F_L)$.

15. A power conversion and generation system adapted to produce and deliver AC power to an AC grid comprising:
  a power generation unit for producing DC power; and
  a DC/AC converter apparatus according to claim 11.

16. Apparatus according to claim 11 wherein said means for measuring the frequency and the frequency change of the AC voltage at the point of common coupling between said DC/AC converter and the grid are adapted to measure said frequency through detection of AC voltage zero crossing.

17. Apparatus according to claim 11 wherein said means for measuring the frequency and the frequency change of the AC voltage at the point of common coupling are adapted to calculate said frequency change as a difference between an actual value and a short moving average of a plurality of previous sampled values of said frequency, said short moving average being calculated on a number of sampled values of said frequency smaller than 10.

18. Apparatus according to claim 11 wherein said means for generating a perturbation ($\Delta\omega_0$) are adapted to generate a perturbation ($\Delta\omega_0$) alternatively positive, for a certain number n of AC voltage cycles, and negative for a certain number m of AC voltage cycles, n and m being integer numbers, until a frequency drift is detected by said means for measuring the frequency and the frequency change of the AC voltage at the point of common coupling between said DC/AC converter and the grid, then the sign of said perturbation ($\Delta\omega_0$) is kept constant and equal to the last sign said perturbation ($\Delta\omega_0$) had assumed.

19. Apparatus according to claim 18 wherein said means for measuring the frequency and the frequency change of the AC voltage at the point of common coupling between said DC/AC converter and the grid are adapted to measure said frequency through detection of AC voltage zero crossing.

20. Apparatus according to claim 18 wherein said means for measuring the frequency and the frequency change of the AC voltage at the point of common coupling are adapted to calculate said frequency change as a difference between an actual value and a short moving average of a plurality of previous sampled values of said frequency, said short moving average being calculated on a number of sampled values of said frequency smaller than 10.

\* \* \* \* \*